(12) United States Patent
Zhang et al.

(10) Patent No.: US 10,692,731 B2
(45) Date of Patent: Jun. 23, 2020

(54) SEMICONDUCTOR STRUCTURE AND FABRICATION METHOD WITH PRECISE PATTERNING THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Cheng Long Zhang, Shanghai (CN); Shi Liang Ji, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/101,128

(22) Filed: Aug. 10, 2018

(65) Prior Publication Data

US 2019/0067127 A1 Feb. 28, 2019

(30) Foreign Application Priority Data

Aug. 22, 2017 (CN) .......................... 2017 1 0727100

(51) Int. Cl.
*H01L 21/32* (2006.01)
*H01L 21/8238* (2006.01)
(Continued)

(52) U.S. Cl.
CPC .......... *H01L 21/32* (2013.01); *H01L 21/0276* (2013.01); *H01L 21/0332* (2013.01); *H01L 21/0337* (2013.01); *H01L 21/266* (2013.01); *H01L 21/31116* (2013.01); *H01L 21/31127* (2013.01); *H01L 21/823821* (2013.01); *H01L 27/0924* (2013.01); *H01L 29/66803* (2013.01);
(Continued)

(58) Field of Classification Search
CPC ..... H01L 21/823821; H01L 21/823807; H01L 21/823814; H01L 21/32; H01L 21/266; H01L 21/3105–31155; H01L 21/027; H01L 21/0334; H01L 21/02107–02362
See application file for complete search history.

(56) References Cited

U.S. PATENT DOCUMENTS 6,121,123 A 9/2000 Lyons et al.
9,691,664 B1 * 6/2017 Sung ................ H01L 29/66795
(Continued)

*Primary Examiner* — Scott B Geyer
(74) *Attorney, Agent, or Firm* — Anova Law Group, PLLC

(57) ABSTRACT

Semiconductor structures and fabrication methods are provided. An exemplary fabrication method includes providing a base substrate having a first region and a second region; forming a first filling layer on the first region of the base substrate and a first hard mask layer on the first filling layer; performing a first treatment process on the second region of the base substrate using the first hard mask layer and the first filling layer as a mask; forming a second filling layer on the first region of the base substrate and a second mask on at least the second filling layer; removing the first hard mask layer and the first filling layer to expose the first region of the base substrate and to pattern the second hard mask layer on the second filling layer; and performing a second treatment process on the first region of the base substrate.

19 Claims, 8 Drawing Sheets

(51) Int. Cl.
  *H01L 21/311*  (2006.01)
  *H01L 21/266*  (2006.01)
  *H01L 21/027*  (2006.01)
  *H01L 21/033*  (2006.01)
  *H01L 29/66*  (2006.01)
  *H01L 27/092*  (2006.01)
  *H01L 29/78*  (2006.01)

(52) U.S. Cl.
  CPC .. *H01L 29/7853* (2013.01); *H01L 21/823807* (2013.01); *H01L 21/823814* (2013.01)

(56) References Cited

U.S. PATENT DOCUMENTS

| | | | |
|---|---|---|---|
| 2014/0370672 A1* | 12/2014 | Kim | H01L 21/823807 438/217 |
| 2016/0196975 A1* | 7/2016 | Tao | H01L 23/306 438/703 |
| 2016/0329253 A1* | 11/2016 | Liu | H01L 29/0649 |
| 2017/0352595 A1* | 12/2017 | Li | H01L 21/0257 |
| 2018/0096998 A1* | 4/2018 | Sung | H01L 27/0886 |
| 2018/0286982 A1* | 10/2018 | Krishnan | H01L 29/66795 |

\* cited by examiner

SEMICONDUCTOR STRUCTURE AND FABRICATION METHOD WITH PRECISE PATTERNING THEREOF

CROSS-REFERENCES TO RELATED APPLICATIONS

This application claims the priority of Chinese patent application No. 201710727100.8, filed on Aug. 22, 2017, the entirety of which is incorporated herein by reference.

FIELD OF THE DISCLOSURE

The present disclosure generally relates to the field of semiconductor manufacturing technologies and, more particularly, relates to semiconductor structures and fabrication methods.

BACKGROUND

With the rapid development of semiconductor manufacturing technologies, semiconductor devices have been developed toward high device density and high integration level. As basic semiconductor devices, transistors have been widely used. With the continuous increase of the device density and the integration level of the semiconductor devices, the critical dimension (CD) of the transistors has become smaller and smaller. To reduce the parasitic capacitance of the gate structure of the transistor and increase the device speed, the gate structure having a high dielectric constant (high-K) dielectric layer and a metal gate (HKMG) has been introduced into the transistor.

However, conventional methods for forming the metal gate on the high-K dielectric layer still face some issues. One of the issues is the mismatch of the work-functions. Because the work-function directly affects the threshold voltage (Vt) and the performance of the device, introducing a work function layer is able to adjust the threshold voltage of the device.

To integrate the semiconductor structures having different threshold voltages, it is desired to form work function layers having the different types and/or different thicknesses on the different regions of a same substrate. One approach is to form different work function layers using patterned mask layers.

However, the precisions of the patterned mask layers are relatively low, it may cause a performance degradation to the semiconductor structure. The disclosed methods and semiconductor structures are directed to solve one or more problems set forth above and other problems in the art.

BRIEF SUMMARY OF THE DISCLOSURE

One aspect of the present disclosure includes a method for fabricating a semiconductor structure. The method includes providing a base substrate having a first region and a second region; forming a first filling layer on the first region of the base substrate and a first hard mask layer on the first filling layer; performing a first treatment process on the second region of the base substrate using the first hard mask layer and the first filling layer as a mask; forming a second filling layer on the first region of the base substrate and a second mask on at least the second filling layer; removing the first hard mask layer and the first filling layer to expose the first region of the base substrate and to pattern the second hard mask layer on the second filling layer; and performing a second treatment process on the first region of the base substrate.

Another aspect of the present disclosure includes a semiconductor structure. The semiconductor structure includes a base substrate having a first region and a second region, a first filling layer formed on the first region of the base substrate; a first hard mask layer formed on the first filling layer; a second filling layer formed on the second region of the base substrate in treated by a first treatment process; and a second hard mask layer formed on the second filling layer.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

FIGS. 1-8 illustrate structures corresponding to certain stages during a fabrication process of a semiconductor structure.

Figure 1:
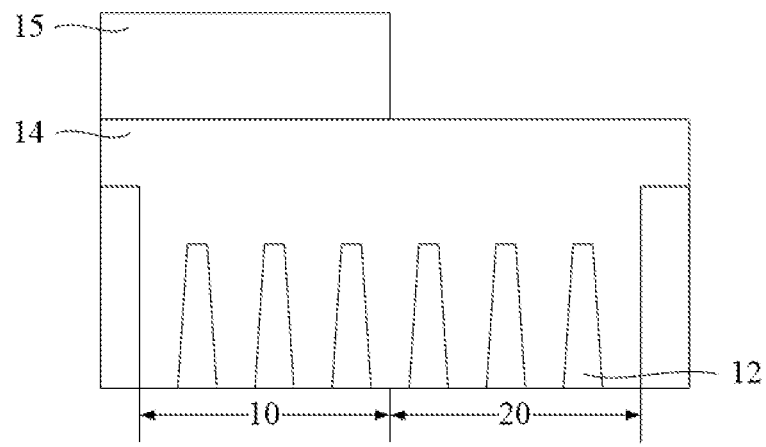
FIGS. 1-8 illustrate structures corresponding to certain stages during a fabrication process of a semiconductor structure.

As shown in FIG. 1, the fabrication process includes providing a base substrate having a first region 10 and a second region 20; performing a first ion implantation process on the base substrate in the first region 10; and performing a second ion implantation process on the base substrate in the second region 20. The base substrate may include a semiconductor substrate (not shown) and a plurality of fins 12 on the semiconductor substrate.

Further, the process includes forming a first filling layer 14 covering the fins 12 over the base substrate; and forming a first photoresist layer 15 on the first filling layer 14 on the base substrate in the first region 10. The first photoresist layer 15 exposes the first filing layer 14 on the base substrate in the second region 20.

Figure 2:
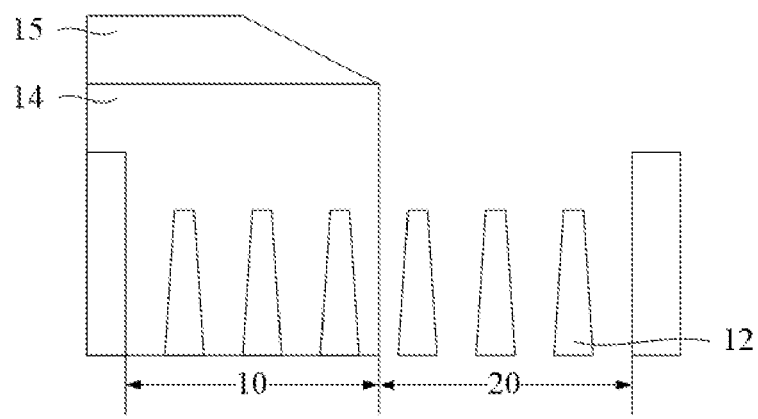

In FIG. 2, the fabrication process includes removing the exposed portion of the first filling layer 14 to expose the fins 12 in the second region 20 using the first photoresist layer 15 as a mask.

Figure 3:
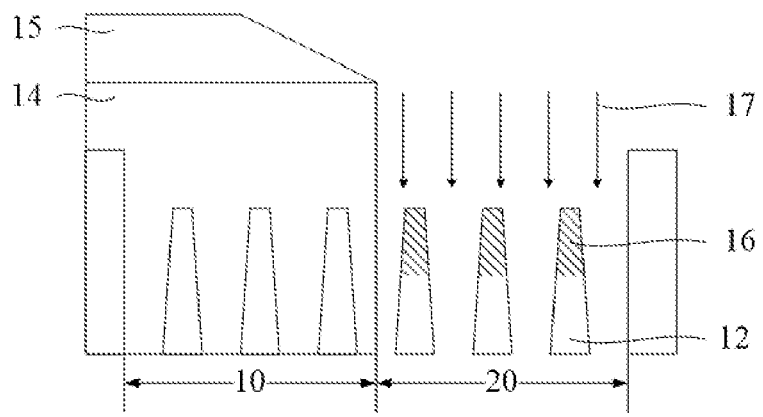

In FIG. 3, the fabrication process includes performing a first ion implantation process 17 on the exposed fins 12 in the second region 20 to form a first doped region 16 in the second region 20 using the first photoresist layer 15 and the remaining first filling layer 14 as a mask.

Figure 4:
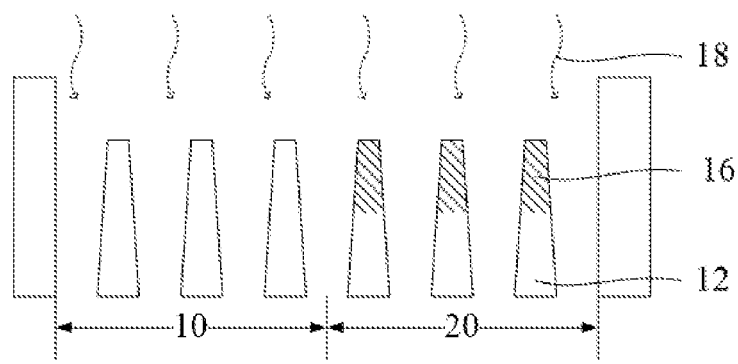

In FIG. 4, the fabrication process includes performing a first ashing process 18 to remove the remaining first photoresist layer (refer to FIG. 3) and the remaining first filling layer 14 (referring to FIG. 3).

Figure 5:
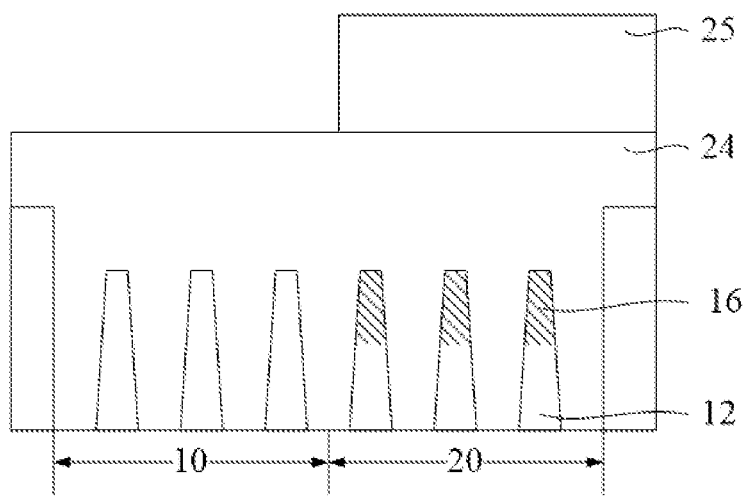

In FIG. 5, a second filling layer 24 is formed over the base substrate. The second filling layer 24 covers the fins 12 in the first region 10 and the second region 20; and a second photoresist layer 25 is formed on the surface of the second filling layer 24 on the base substrate in the second region 20. The second photoresist layer 25 exposes the second filling layer 24 on the base substrate in the first region 10.

Figure 6:
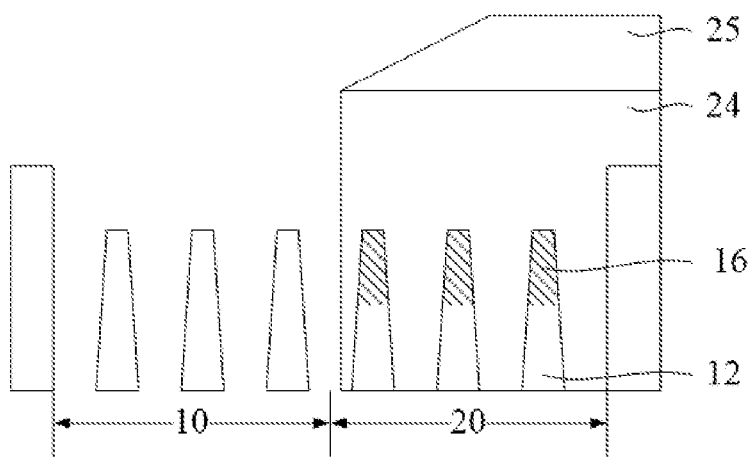

In FIG. 6, the exposed portion of the second filling layer 24 is removed to expose the fins 12 on the base substrate in the first region 10 using the second photoresist layer 25 as a mask.

Figure 7:
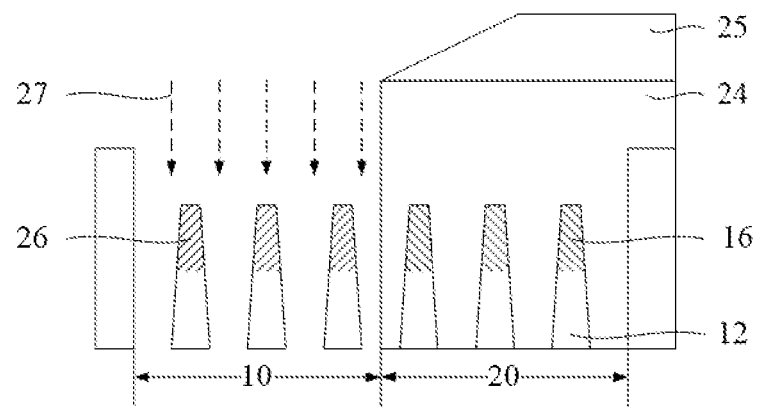

In FIG. 7, a second ion implantation process 27 is performed on the exposed fins 12 in the first region 10 to form a second region 26 in the fins 12 in the first region 10 using the second photoresist layer 25 and the remaining filling layer 24 as a mask.

Figure 8:
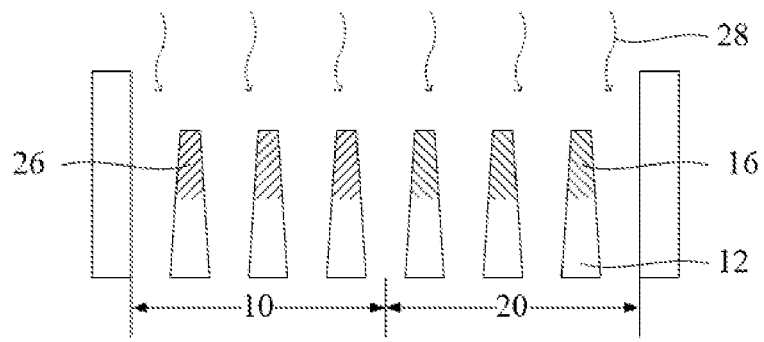

In FIG. 8, an ashing process 28 is performed to remove the remaining first photoresist layer 15 and the remaining first filling layer 14.

To perform the first ion implantation process 17 and the second ions implantation process 27 on the base substrate in the first region 10 and the base substrate in the second region 20 respectively to form the first doped region 16 and the second doped region 26 in the fins 12 in the second region 20 and the first region 10 respectively, it needs to form the first filling layer 14 and the photoresist layer 15 on the base substrate in the first region 10, and the second filling layer 24 and the second photoresist layer 25 on the base substrate in the second region 20 respectively. The first filling layer 14 and the first photoresist layer 15 expose the fins 12 in the second region 20. The second filling layer 24 and the second photoresist layer 25 expose the fins 12 in the first region 10.

During forming the first filling layer 14 and the first photoresist layer 15, a first patterning process using a mask is performed. During forming the second filling layer 24 and the second photoresist layer 25, a second patterning process using a mask is performed. The first patterning process and the second patterning process both need the masks, the masks may have an overlay issue during the two times of patterning processes. Thus, the precisions of the patterning processes may be reduced; and the properties of the semiconductor structure may degrade.

The present disclosure provides a semiconductor structure and a fabrication method. In the disclosed fabrication method, after forming the second hard mask layer, the first mask layer and the first filling layer may be removed. By using the process for removing the first mask layer and the first filling layer, the second mask layer may be patterned. Thus, the multiple overlay alignments may be avoided; and the precision of the patterning processes may be improved; and the electrical properties of the semiconductor structure may be improved.

Figure 19:
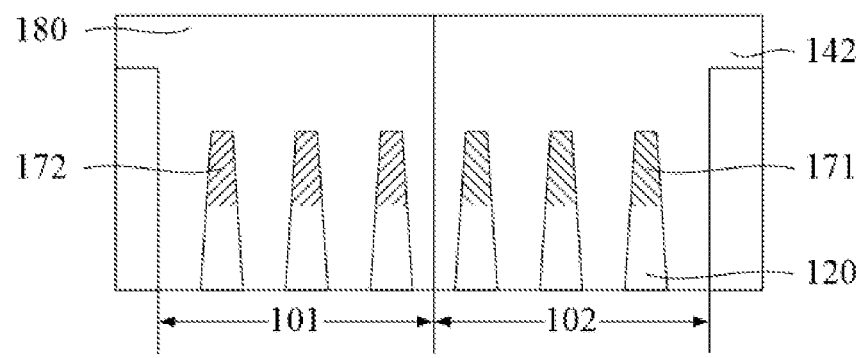
Figure 20:
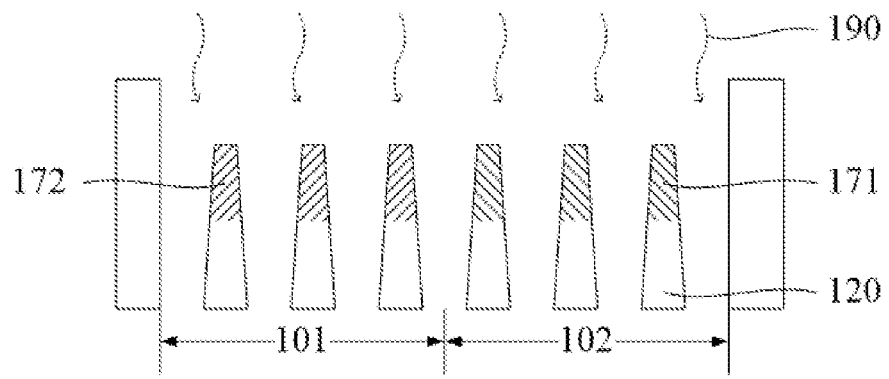
Figure 21:
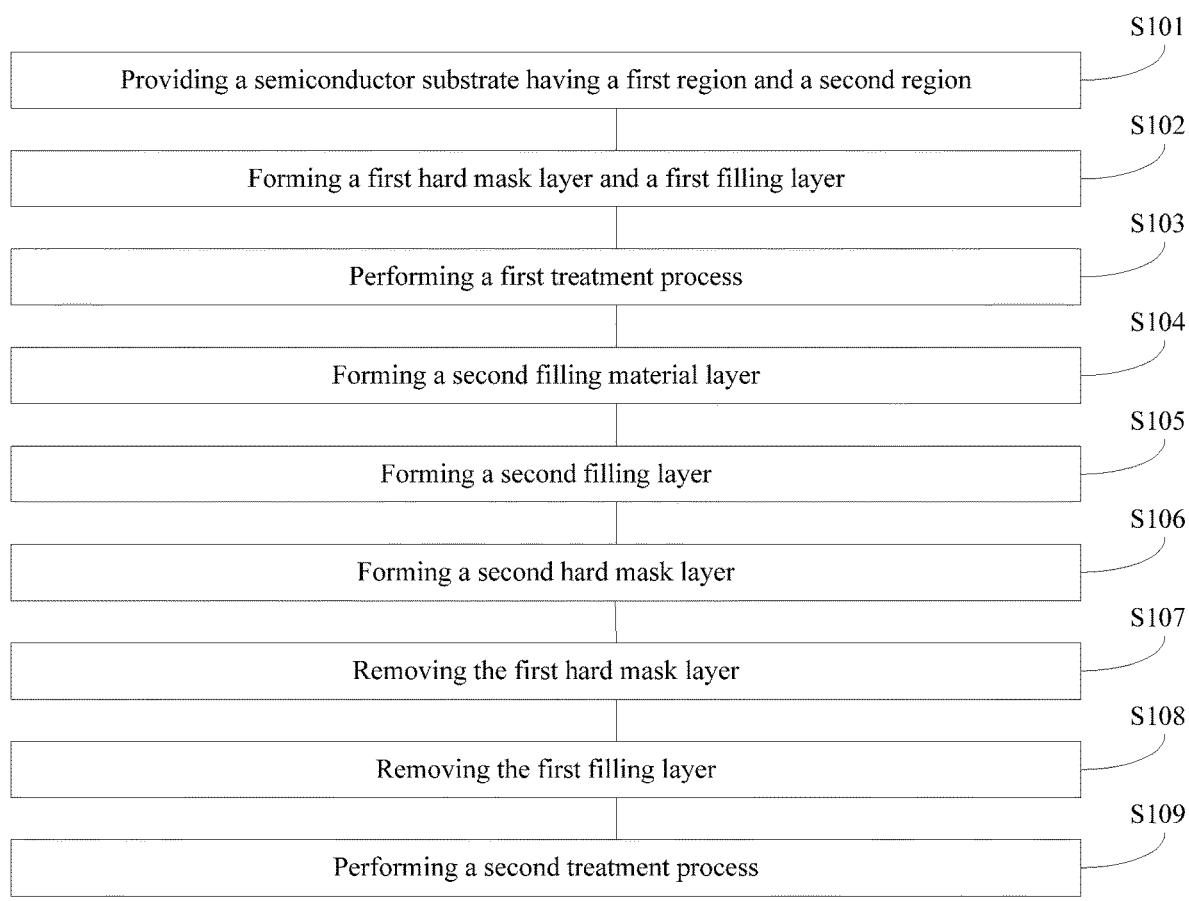
FIG. 21 illustrates an exemplary fabrication process of a semiconductor structure consistent with various disclosed embodiments.

FIG. 21 illustrates an exemplary fabrication process of a semiconductor structure consistent with various disclosed embodiments. FIGS. 9-20 illustrate structures corresponding to certain stages during the exemplary fabrication process.

Figure 9:
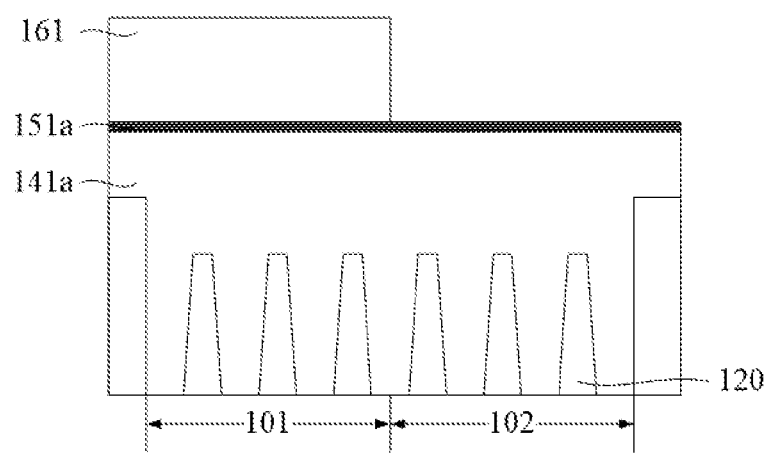
FIGS. 9-20 illustrate structures corresponding to certain stages during an exemplary fabrication process of a semiconductor structure consistent with various disclosed embodiments.

As shown in FIG. 21, at the beginning of the fabrication process, a semiconductor substrate with certain structures is provided (S101). FIG. 9 illustrates a corresponding semiconductor structure.

As shown in FIG. 9, a base substrate is provided. The base substrate may have a first region 101 and a second region 102. A first treatment process may be subsequently performed on the base substrate in the first region 101; and a second treatment process may be subsequently performed on the base substrate in the second region 102.

In one embodiment the semiconductor structure is a fin field-effect transistor. Thus, the base substrate may include a semiconductor substrate (not shown) and a plurality of fins 120 formed on the semiconductor substrate.

The base substrate provides a process base for subsequent processes.

In one embodiment, the base substrate in the first region 101 and the base substrate in the second region 102 may be used to form different doped regions of semiconductor structures with different electrical properties. Specifically, the base substrate in the first region 101 and the base substrate in the second region 102 may be used to form different types of transistors. For example, the base substrate in the first region 101 may be used to form a P-type transistor; and the base substrate in the second region 102 may be used to form an N-type transistor.

In one embodiment, for illustrative purposes, the process for forming different types of transistors is described. In some embodiments, the base substrate in the first region and the base substrate in the second region may be used to form semiconductor structures with different properties. That is, the base substrate in the first region and the base substrate in the second region may be subsequently treated with different processes.

The base substrate provides a process platform for subsequently forming a semiconductor structure. The channel region of the semiconductor structure may be in the fins 120.

In one embodiment, the semiconductor substrate is made of single crystal silicon. In some embodiments, the semiconductor substrate may be made of polysilicon, amorphous silicon, germanium, silicon germanium, silicon carbide, gallium arsenide, or gallium indium, etc. In some embodiments, the semiconductor structure may also be a silicon on insulator (SOI) substrate, a germanium on insulator (GOI) substrate, or a glass substrate, etc. The semiconductor substrate may be made of a material that is easy to meet the process requirements and to be integrated.

In one embodiment, the fins 120 are made of a same material as the semiconductor substrate, such as a single crystal silicon. In some embodiments, the fins and the semiconductor substrate are made of different materials. The fins may be made of germanium, silicon germanium, silicon carbide, gallium arsenide, or gallium indium, etc.

In one embodiment, the base substrate and the fins 120 may be formed simultaneously. The process for forming the semiconductor substrate and the fins 120 may include providing an initial substrate; forming a patterned fin mask layer on the initial substrate; and etching the initial substrate using the patterned fin mask as an etching mask to form the semiconductor substrate and the fins 120 protruding from the semiconductor substrate.

Further, as shown in FIG. 9, a first filling material layer 141a may be formed over the base substrate; a first hard mask material layer 151a may be formed on the first filling material layer 141a; and a first photoresist layer 161 may be formed on the first hard mask material layer 151a in the first region 101. The first filling material layer 141a may be used to subsequently form a first filling layer; the first hard mask material layer 151a may be used to subsequently form a first hard mask layer; and the first photoresist layer 161 may be used as a mask for forming the first hard mask layer.

In one embodiment, the first filling material layer 141a may be formed by a spin-coating process. Using the spin-coating process to form the first filling material layer 141a may be able to increase the gap filling ability of the first filling material layer 141a. Accordingly, the flatness of the first filling material layer 141a may be increased; and the quality of the subsequently formed first filling layer may be increased. In some embodiments, the first filling material layer may be formed by other appropriate method.

The first photoresist layer 161 may be formed on the first hard mask material 151a in the first region 101. The first photoresist layer 161 may be used as an etching mask for subsequently forming a first hard mask layer and a first filling layer.

Figure 10:
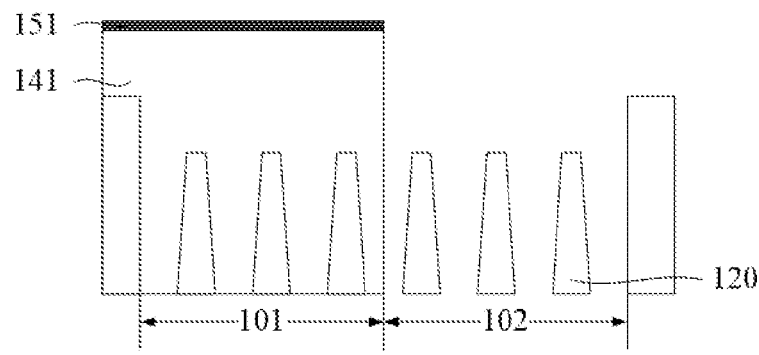

Returning to FIG. 21, after forming the first photoresist layer, a first hard mask layer and a first filling layer maybe formed (S102). FIG. 10 illustrates a corresponding semiconductor structure.

As shown in FIG. 10, a first filling layer 141 may be formed on the base substrate in the first region 101; and a first hard mask layer 151 may be formed on the first filling layer 141.

In one embodiment, the first filling layer 141 may fill the gap between the adjacent fins 120 in the first region 101; and the top surface of the first filling layer 141 may be higher than the top surfaces of the fins 120. The first hard mask layer 151 may cover the first filling layer 141. The first filling layer 141 and the first hard mask layer 151 may both expose the fins 120 in the second region 102.

The first filling layer 141 and the first hard mask layer 151 may cover the base substrate in the first region 101. Accordingly, The first filling layer 141 and the first hard mask layer 151 may be used to protect the base substrate in the first region 101; and the adverse effect of the subsequent first treatment process to the base substrate in the first region 101 may be prevented.

Further, during the process for forming the first filling layer 141, the first hard mask layer 151 may be used as a mask to define the size and the position of the first filling layer 141 so as to form the first filling layer 141 covering the base substrate in the first region 101; and expose the base substrate in the second region 102.

In one embodiment, the first filling layer 141 may be made of spin-coated carbon coating material. In some embodiments, the first filling layer may also be made of one or more of a spin-coated carbon coating material, a bottom anti-reflective coating material, and an organic dielectric coating material, etc.

Using one or more of a spin-coated carbon coating material, a bottom anti-reflective coating material, and an organic dielectric coating material to make the first filling layer 141 may provide a relatively flat surface for forming the first hard mask layer 151. Accordingly, the precision and the quality of the first hard mask layer 151 may be improved; and the precision and the quality of the first filling layer 141 may be improved.

In one embodiment, the first hard mask layer 151 is made of a silicon-containing bottom anti-reflective coating material. The silicon-containing bottom anti-reflective coating material may have a relatively high density. Thus, comparing with the first filling layer 141, the first hard mask layer 151 may have a relatively high etching selectivity ratio. Accordingly, the quality of the first filling layer 141 may be effectively increased; and the precision and the yield of the patterning process may be effectively increased. Further, using the silicon-containing bottom anti-reflective coating material as the first hard mask layer 151 may be able to increase the process compatibility between the process for forming the first hard mask layer 151 and the process for forming the first filling layer 141. Accordingly, the process difficulty may be reduced; and the yield may be increased.

The thickness of the first hard mask layer 151 may be any appropriate value. If the thickness of the first hard mask layer 151 is too small, the masking effect of the first hard mask layer 151 during forming the filling layer 141 may be affected. Further, the protection ability of the first hard mask layer 151 during the subsequent first treatment process may be affected; and the precision and the yield of the first treatment process may be adversely affected. If the thickness of the first hard mask layer 151 is too large, it may cause a waste of material; and the process difficulty may be increased.

In one embodiment, the thickness of the first hard mask layer 151 may be in a range of approximately 20 Å-1000 Å.

In one embodiment, as shown in FIGS. 9-10, the process for forming the first filling layer 141 and the first hard mask layer 151 may include forming the first filling material layer 141a over the base substrate and forming the first hard mask material layer 151a on the first filling material layer 141a; and patterning the first hard mask material layer 151a to expose the first filling material layer 141a in the second region 102 to form the first hard mask layer 151; and removing the exposed portion of the first filling material layer 141a using the first hard mask layer 151 as an mask to form the first filling layer 141.

Patterning the first hard mask material layer 151a may be used to expose the first filling material layer 141a on the base substrate in the second region 102. Thus, a process base may be provided for subsequently forming the first filling layer 141.

The process for patterning the hard mask material layer 151a may include forming the photoresist layer 161 on the first hard mask material layer 151a. The photoresist layer 161 may be patterned to cover the first hard mask material layer 151a in the first region 101 and to expose the hard mask material layer 151a in the second region 102. Then, the exposed first hard mask material layer 151a may be etched using the first photoresist layer 161 as an etching mask to form the first hard mask layer 151.

The first hard mask layer 151 may be formed over the base substrate in the first region 101; and the first filling material layer 141a over the base substrate in the second region 102 may be exposed. As shown in FIG. 10, after forming the first hard mask layer 151, the first filling layer 141a may be etched using the first hard mask layer 151 as an etching mask to form the first filling layer 141.

In one embodiment, the first photoresist layer 161 may be consumed up during etching the first mask material layer 151a. In some embodiments, the first photoresist layer may not be entirely consumed up during etching the hard mask material layer; and some residues may be left over the first hard mask material layer. However, the left-over residues may not affect the subsequent processes.

Figure 11:
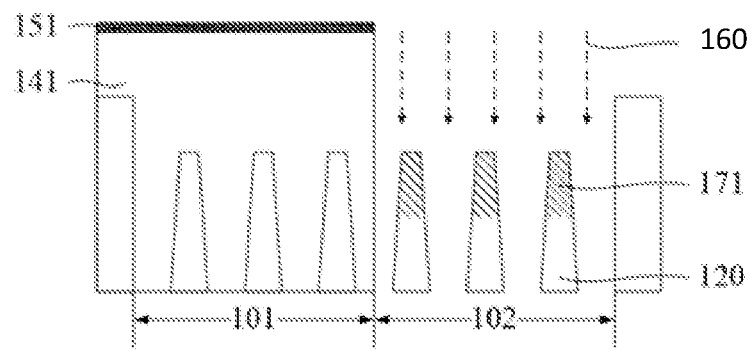

Returning to FIG. 21, after forming the first filling layer and the first hard mask layer, a first treatment process may be performed (S103). FIG. 11 illustrates a corresponding semiconductor structure.

As shown in FIG. 11, a first treatment process 160 is performed on the base substrate in the second region 102 using the first hard mask layer 151 and the first filling layer 141 as a mask.

In one embodiment, for illustrative purposes, the process for forming the doped regions of different types of the transistors is described, the first treatment process 160 may be a first ion implantation process 160. Thus, the first ion implantation process 160 may be performed on the base substrate in the second region 102.

The first ion implantation process 160 may be used to form the first doped region 171 in the fins 120 in the second region 102. In particular, the first ion implantation process 160 may be a source/drain doping process. Thus, the first doped region 171 may be used to form the doped source/ drain regions of the semiconductor structure. In some embodiments, the first ion implantation process may be a lightly doped ion implantation process, a pocket ion implantation process, or an anti-punch-through ion implantation process, etc.

In one embodiment, the base substrate in the second region 102 may be used to form N-type transistors, the ions implanted by the first ion implantation process 160 may be N-type ions, such as phosphor ions, arsenic ions, or antimony ions, etc. That is, the first doped region 171 may be doped with N-type doping ions.

Figure 12:
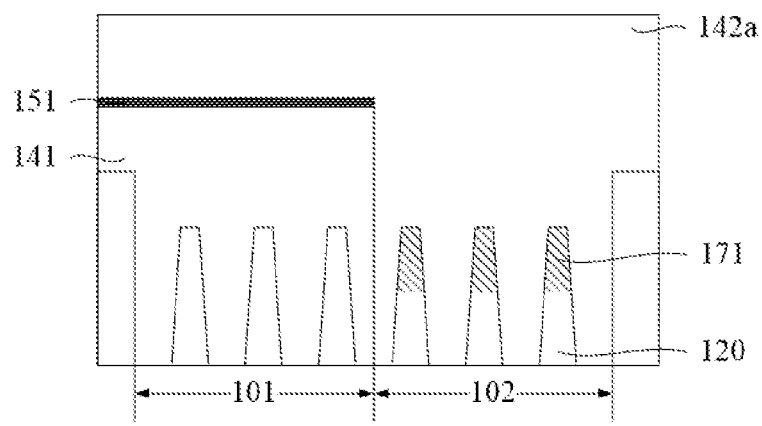

Returning to FIG. 21, after forming the first doped region, a second filling material layer may be formed (S104). FIG. 12 illustrates a corresponding semiconductor structure.

As shown in FIG. 12, a second filling material layer 142a is formed on the base substrate in the second region 102. The second filling material layer 142a may also cover the first hard mask layer 151.

The second filling material layer 142a may be used to subsequently form a second filling layer.

Various processes may be used to form the second filling material layer 142a. In one embodiment, a spin-coating process is used to form the second filling material layer 142a. Using the spin-coating process to form the second filling material layer 142a may be able to increase the gap filling ability of the second filling material layer 142a; and increase the flatness of the second filling material layer 142a. Accordingly, the quality of the subsequently formed second filling layer may be improved.

The second filling material layer 142a may be made of any appropriate material, such as a bottom antireflective coating material, an organic dielectric material, or a spin-coated carbon material, etc.

Figure 13:
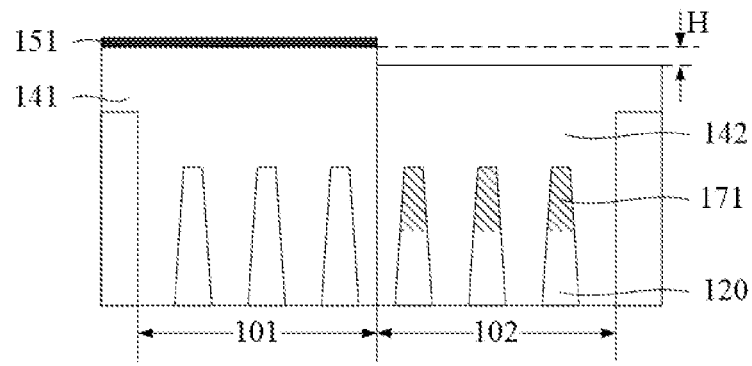

Returning to FIG. 21, after forming the second filling material layer, a second filling layer may be formed (S105). FIG. 13 illustrates a corresponding semiconductor structure.

As shown in FIG. 13, a second filling layer 142 is formed. The second filling layer 142 may be formed over the base substrate in the second region 102. In one embodiment, the second filling layer 142 may fill the gaps between adjacent fins 120; and the top surface of the second filling layer 142 may be higher than the top surfaces of the fins 120.

The second filling layer 142 and the subsequently formed second hard mask layer may be used to cover the base substrate in the second region 102 so as to protect the base substrate in the second region 102 during a subsequent second treatment process. Accordingly, the adverse effect of the second treatment process to the base substrate in the second region 102 may be avoided.

In one embodiment, the second filling layer 142 may be made of one or more of a bottom anti-reflective coating material, an organic dielectric material, or a spin-coated carbon material, etc. The gap filling ability of the second filling layer 142 may be sufficiently good to fill the gaps between adjacent fins 120. Accordingly, the protective ability of the second filling layer 142 may be improved.

Using one or more of a bottom anti-reflective coating material, an organic dielectric material, or a spin-coated carbon material, etc. as the material of the second filling layer 102 may be able to increase the flatness of the second filling layer 142. Thus, a relatively flat surface may be provided for subsequently forming a second hard mask layer; and the quality of the subsequently formed second hard mask layer may be improved.

Further, as shown in FIG. 13, in one embodiment, the top surface of the second filling layer 142 may be lower than the top surface of the first filling layer 141. Such a configuration may be able to reduce the process difficulty for subsequently forming the second hard mask layer; and increase the surface flatness of the second hard mask layer. Thus, the quality of the second hard mask layer may be increased; and the yield and structural properties of the semiconductor structure may be improved.

Referring to FIG. 13, the height difference "H" between the top surface of the second filling layer 142 and the top surface of the first filling layer 141 may be any appropriate value. If the height difference "H" between the top surface of the second filling layer 142 and the top surface of the first filling layer 141 is too small, the process difficulty for subsequently forming the second hard mask layer may be increased; and it may not be easy to improve the yield and structural properties of the semiconductor structure.

In one embodiment, the height difference "H" between the top surface of the second filling layer 142 and the top surface of the first filling layer 141 may be greater than, or equal to approximately 50 Å.

Referring to FIGS. 12-13, the second filling layer 142 may be formed by performing a first etch-back process on the second filling material layer 142a. The second etch-back process may be used to form the second filling layer; and a process base may be provided for subsequently forming the hard mask layer.

In one embodiment, the top surface of the second filling layer 142 may be lower than the top surface of the first filling layer 141. The first etch-back process may not only remove the portion of the second hard mask material layer 142a on the first hard mask layer 151, but also remove a portion of the second hard mask material layer 142a to cause the top surface of the second filling layer 142 to be lower than the top surface of the first filling layer 141. Thus, the interface between the first filling layer 141 and the first hard mask layer 151 and the top surface of the second filling layer 142 may have the height difference "H".

In one embodiment, the first etch-back process may be a plasma etching process. The etching gas of the plasma etching process may be a mixture of $N_2$ and $H_2$, or a mixture including one or more of CO, $CO_2$, $O_2$, $CH_4$ and $SO_2$, etc.

Figure 14:
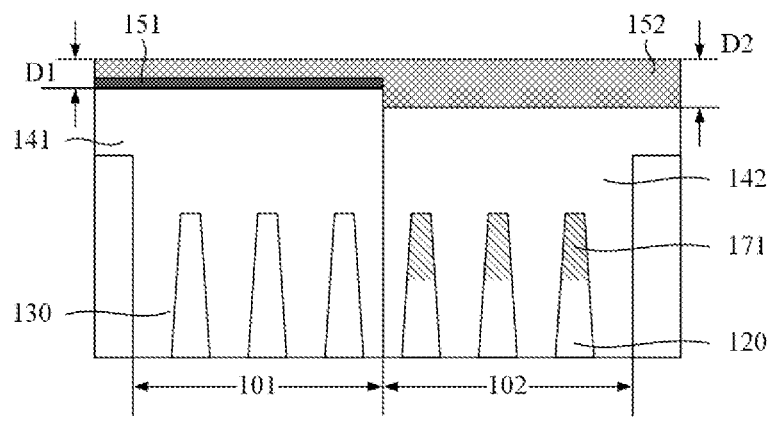

Returning to FIG. 21, after forming the second filling layer, a second hard mask layer may be formed (S106). FIG. 14 illustrates a corresponding semiconductor substrate.

As shown in FIG. 14, a second hard mask layer 152 may be formed on at least the second filling layer 142. In one embodiment, the second hard mask layer 152 may be formed on both the second filling layer 142 and the first hard mask layer 151.

Forming the second hard mask layer 152 on the second filling layer 142 and the first hard mask layer 151 may be able to subsequently pattern the remaining the second hard mask layer 152 by subsequently removing the first hard mask layer 151 and the first filling layer 141. Thus, the patterning process for forming the second hard mask layer may not be required. Accordingly, the overlay alignment issue for multiple-patterning processes may be effectively avoided. Thus, the precision of the patterning processes may be increased; and the performance of the semiconductor structure may be improved. Further, reducing the times of the patterning processes may be able to simplify the process steps; and reduce the production cost.

To allow the second hard mask layer 152 on the second filling layer 142 to still have a left-over portion after subsequently removing the first hard mask layer 151 and the first filling layer 141 and protect the base substrate in the second region 102 during a subsequent second treatment process, in one embodiment, as shown in FIG. 14, the total thickness "D1" of the first hard mask layer 151 and the second hard mask layer 152 on the first hard mask layer 151 may be smaller than the thickness "D2" of the second hard mask layer 152 on the second filling layer 142.

The thickness "D2" of the second hard mask layer 152 on the second filling layer 142 may be any appropriate value. If the thickness "D2" of the second hard mask layer 152 on the second filling layer 142 is too small, the thickness of the remaining second hard mask layer 152 after subsequently removing the first hard mask layer 151 and the first filling layer 141 may be too small, the protective ability of the second hard mask layer 152 to the base substrate in the second region 102 may be adversely affected. Thus, the probability of the damage to the base substrate in the second region 102 may be increased; and it may not facilitate to increase the yield and the performance of the semiconductor structure.

The second hard mask layer 152 may be formed by any appropriate process. In one embodiment, the second hard mask layer 152 may be formed by a spin-coating process. Using the spin-coating process to form the second hard mask layer 152 may be able to increase the flatness of the second hard mask layer 152; and increase the quality of the second mask layer 152. Further, because the top surface of the second filling layer 142 may be lower than the top surface of the first filling layer 141, using the spin-coating process to form the second hard mask layer 152 may utilize the height difference between the top surface of the second filling layer 142 and the top surface of the first filling layer 141 to form the second hard mask layer 152 having different thicknesses in different regions. Thus, the process difficulty for forming the second hard mask layer 152 may be reduced; and the yield and the performance of the semiconductor structure may be improved.

Figure 15:
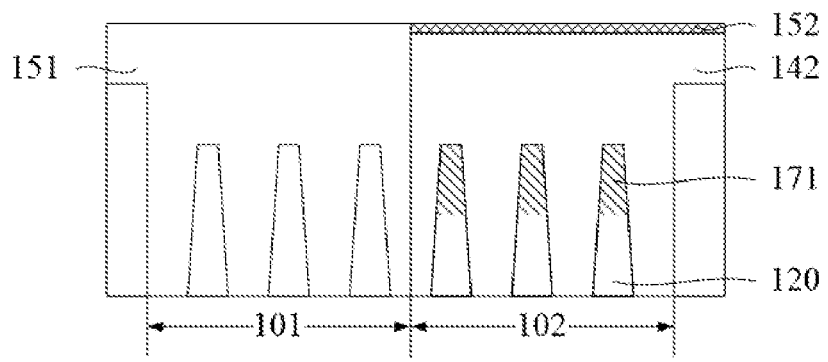

Returning to FIG. 21, after forming the second hard mask layer, the first hard mask layer may be removed (S107). FIG. 15 illustrates a corresponding semiconductor structure.

As shown in FIG. 15, the first hard mask layer 151 may be removed; and the second hard mask layer 152 may be patterned. For example, the portion of the second hard mask layer 152 on the first hard mask layer 151 may be removed.

Referring to FIG. 14, the second hard mask layer 152 may be formed on the second filling layer 142; and may be also be formed on the first hard mask layer 151. Thus, during the process for removing the first hard mask layer 151, the portion of the second hard mask layer 152 on the first hard mask layer 151 may also be removed. Thus, the remaining second mask layer 152 may only cover the base substrate in the second region 102. For example, the second hard mask layer 152 may be patterned to expose the first filling layer 141.

The first hard mask layer 151 may be removed by any appropriate process. In one embodiment, the first hard mask layer 151 is removed by performing a second etch-back process to expose the first filling layer 141.

In one embodiment, the second etch-back process may remove the first hard mask layer 151 and the portion of the second hard mask layer 152 on the first filling layer 141 to expose the first filling layer 141. After the second etch-back process, the remaining second hard mask layer 152 may only be over the base substrate in the second region 102, or on the second filling layer 142. For example, the second hard mask layer 152 may have a pattern, or the second hard mask layer 152 may be patterned. Thus, the second hard mask layer 152 may be patterned without using a patterning process. Accordingly, the overlay alignment issue of multiple-patterning processes may be avoided. Thus, the precision of the patterning process may be increased; and the performance of the semiconductor structure may be improved. Further, reducing the times of the patterning processes may be able to simplify the process steps; and the production cost may be reduced.

The second etch-back process may be any appropriate process. In one embodiment, the second etch-back process may be performed by an instrument property tracking process. The etching gas of the second etch-back process may include one or more of a C-F based plasma and a C-H-F based plasma.

Figure 16:
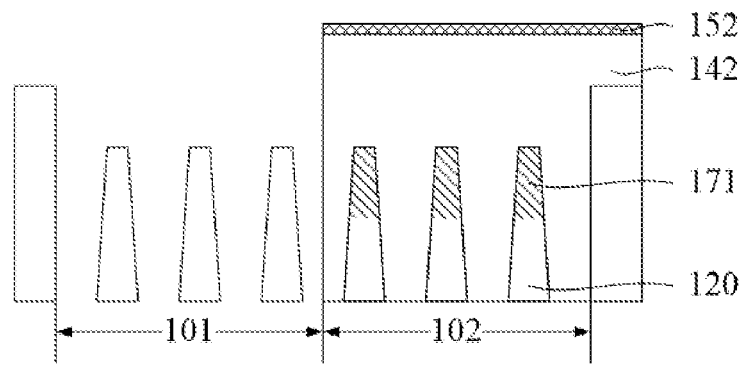

Returning to FIG. 21, after removing the first hard mask layer, the first filling layer may be removed (S108). FIG. 16 illustrates a corresponding semiconductor structure.

As shown in FIG. 16, the first filling layer 141 may be removed; and the base substrate in the first region 101 may be exposed.

Removing the first hard mask layer 151 and the first filling layer 141 may expose the base substrate in the first region 101. Thus, a process base may be provided for subsequently performing a second treatment process. Further, removing the first hard mask layer 151 and the first filling layer 141 after forming the second hard mask layer 152 may be able to pattern the second hard mask layer during removing the first hard mask layer 151 and the first filling layer 141. Thus, an extra process for patterning the second hard mask layer 152 may be avoided. Accordingly, the overlay alignment issue of multiple-patterning processes may be avoided. Thus, the precision of the patterning process may be increased; and the performance of the semiconductor structure may be improved. Further, reducing the times of the patterning processes may be able to simplify the process steps; and the production cost may be reduced.

Referring to FIG. 16, the first filling layer 141 may be removed by an etching process using the second hard mask layer 152 as a mask. In one embodiment, the first filling layer 141 may be made of a spin-coated carbon material. Thus, a wet etching process or a dry etching process may be used to remove the first filling layer 141 to expose the base substrate in the first region 101. After removing the first filling layer 141, the fins 71 in the first region 101 may be exposed.

Figure 17:
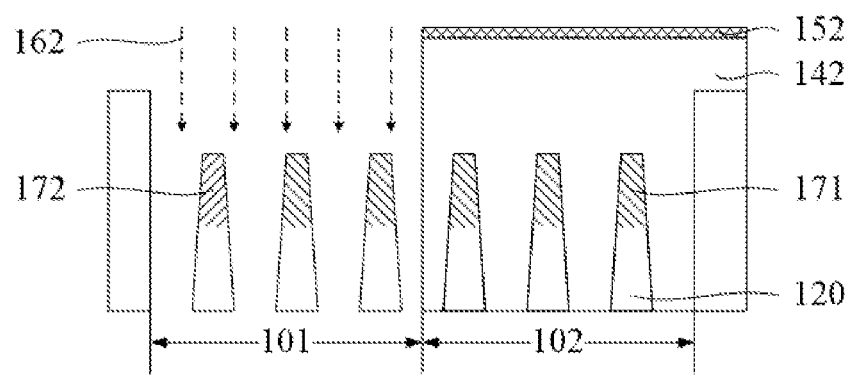

Returning to FIG. 21, after removing the first hard mask layer, a second treatment process may be performed (S109). FIG. 17 illustrates a corresponding semiconductor structure.

As shown in FIG. 17, a second treatment process 162 may be performed on the base substrate in the first region 101 using the second hard mask layer 152 and the second filling layer 142 as a mask.

In one embodiment, for illustrative purposes, the formation of the doped source/drain regions of different types of transistors is described; and the second treatment process 162 is a second ion implantation process 162.

The second ion implantation process 162 may be used to form a second doped region 172 in the fins 120 in the first region 101. In particular, the second ion implantation process 162 may be a source/drain doping process. Thus, the second doped region 172 may be used to form the doped source/drain regions of the semiconductor structure. In some embodiments, the second ion implantation process may also be a lightly doped implantation process, a pocket ion implantation process, or an anti-punch-through ion implantation process, etc.

In one embodiment, the base substrate in the first region 101 may be used to form a P-type transistor, the ions implanted by the second ion implantation process 162 may be N-type ions, such as boron ions, gallium ions, or indium ions, etc. That is, the second doped region 172 may a P-type doped region.

In one embodiment, the first treatment process and the second treatment process are implantation processes doping different types of ions. For example, the first treatment process and the second treatment process may be both ion implantation processes, but the types of the implanted ions may be different. The ions implanted by the second ion implantation process 162 and the ions implanted by the first ion implantation process 160 may be different.

In some embodiments, the first treatment process and the second treatment process may be different ion implantation processes, the implanting energy of the second ion implantation process and the implanting energy of the first ion implantation process may be different. Or, the dosage of the second ion implantation process and the dosage of the first ion implantation process may be different. For example, the first treatment process and the second treatment process may both ion implantation processes but the parameters, such as the types of the ions, the dosages, and/or the energies, may be different.

In other embodiments, the first treatment process and the second treatment process may be other appropriate semiconductor processes. For example, the first treatment process and the second treatment process may be different etching processes, or different growth processes, etc. The first treatment process and the second treatment process may be both etching processes, but the parameters and the etching type of the first treatment process and the second treatment process may be different. Or the first treatment process and the second treatment process may be both growth processes, but the parameters, the materials and the types of the first treatment process and the second treatment processes may be different.

In other embodiments, the first treatment process and the second treatment process may be different semiconductor processes. For example, the first treatment process may be an ion implantation process; and the second treatment process may be an etching process. Or, the first treatment process may be a growth process; and the second treatment process may be an ion implantation process.

Figure 18:
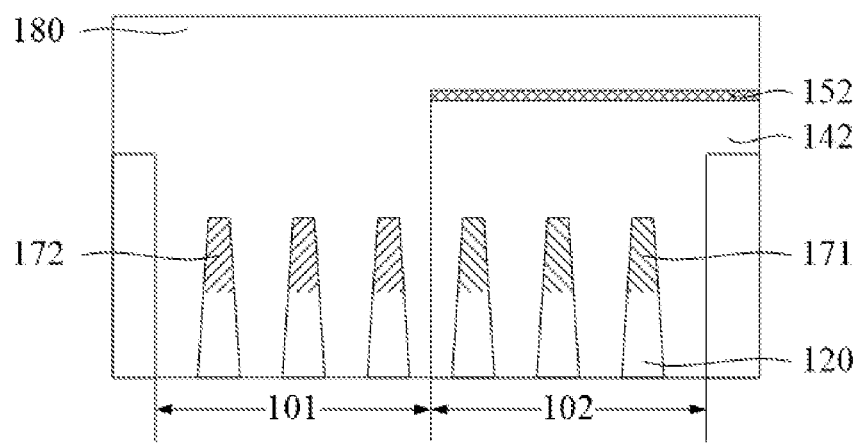

Further, as shown in FIG. 18, after the second treatment process 162, a third filling layer 180 may be formed on the base substrate in the first region 101. Then, as shown in FIG. 19, the second hard mask layer 152 may be removed by performing a third etch-back process. After removing the second hard mask layer 152, as shown in FIG. 20, an ashing process 190 may be performed to remove the second filling layer 142 and the third filling layer 180.

The third filling layer 180 may be used to protect the base substrate in the first region 101 treated by the second treatment process to prevent the damage to the base substrate in the first region 101.

In particular, the third filling layer 180 may fill the gaps between the fins 120 in the first region 101; and the top surface of the third filling layer 180 may be above the top surfaces of the fins 120.

In one embodiment, the third filling layer 180 is made of a spin-coated carbon material formed by a spin-coating process. In some embodiments, the third filling layer may be made of one or more of a spin-coated carbon material, a bottom anti-reflective coating material, and an organic dielectric material, etc.

Using one or more of the spin-coated carbon material, the bottom anti-reflective coating material, and the organic dielectric material to form the third filling material layer 180 by the spin-coating process may be able to increase the gap filling ability of the third filling layer 180; and the surface flatness of the third filling layer 180 may be effectively improved. Thus, the yield and the performance of the semiconductor structure may be improved.

In one embodiment, the third etch-back process may be used to remove the second hard mask layer 152 to expose the second filling layer 142 to reduce the process difficulty for removing the second hard mask layer 142. Accordingly, the yield and the performance of the semiconductor structure may be improved.

In another embodiment, the third filling layer 180 may be made of the spin-coated carbon material. Thus, the third filling layer 180 may not only be formed on the base substrate in the first region 101, but also on the second hard mask layer 152. Thus, the third etch-back process may not only remove the second hard mask layer 152, but only remove a partial thickness of the third filling layer 180.

The detailed description of the third etch-back process may be referred to one or more of the detailed descriptions of the first etch-back process and the second etch-back process.

The ashing process 190 may be used to remove the second filling layer 142 (as shown in FIG. 19) and the third filling layer 180 (as shown in FIG. 20) to provide a surface for the subsequent processes.

In one embodiment, a first work function layer (not shown) and a second work function layer (not shown) may be formed on the fins 120 in the first region 101 and the fins 120 the second region 102, respectively. Gate structures may be subsequently formed over the fins 120; and the gate structures may cover the first work function layer and the second work function layer. The ashing process 190 may be used to remove the second filling layer 142 and the third filling layer 180 to expose the first work function layer and the second work function layer.

Using the ashing process to remove the second filling layer 142 and the third filling layer 180 may effectively reduce the adverse effect of the process for removing the second filling layer 142 and the third filling layer 180 to the base substrate. Thus, the damage to the base substrate may be reduced; and the yield and the performance of the semiconductor structure may be improved.

In one embodiment, the processing gas of the ashing process 190 may include a mixture of $N_2$ and $H_2$ or a mixture containing more or more of CO, $CO_2$, $O_2$, $CH_4$ and $SO_2$, etc.

The present disclosure also provides a semiconductor structure. FIG. 14 illustrates an exemplary semiconductor structure consistent with various disclosed embodiments.

As shown in FIG. 14, the semiconductor structure may include a base substrate. The base substrate may have a first region 101 and a second region 102. The base substrate in the first region 101 may be used to perform a first treatment process; and the base substrate in the second region 102 may be used to perform a second treatment process. The semiconductor substrate may also include a first filling layer 141 on the base substrate in the first region 101; a first hard mask layer 151 on the first filling layer 141; a second filling layer 142 on the base substrate in the second region 102; and a second hard mask layer 152 on the second filling layer 142. Referring to FIG. 11, the base substrate in the second region 102 may be treated by the first treatment process 160. The detailed structures and intermediate structures are described above with respect to the fabrication processes.

In one embodiment, the semiconductor structure may be a fin field-effect transistor. Thus, the base substrate may include a semiconductor substrate (not shown) and a plurality of fins 120 formed on the semiconductor substrate.

The base substrate provides a process base for subsequent processes.

In one embodiment, the base substrate in the first region 101 and the base substrate in the second region 102 may be used to form different doped regions of semiconductor structures with different electrical properties. In particular, the base substrate in the first region 101 and the base substrate in the second region 102 may be used to form different types of transistors. For example, the base substrate in the first region 101 may be used to form a P-type transistor; and the base substrate in the second region 102 may be used to form an N-type transistor.

In one embodiment, for illustrative purposes, the process for forming different type of transistors is described. In some embodiments, the base substrate in the first region and the base substrate in the second region may be used to form semiconductor structures with different properties. For example, the base substrate in the first region and the base substrate in the second region may be subsequently processed with different processes.

The base substrate provides a process platform for subsequently forming a semiconductor structure. The channel region of the semiconductor structure may be in the fins 120.

In one embodiment, the semiconductor substrate is made of single crystal silicon. In some embodiments, the semiconductor substrate may be made of polysilicon, amorphous silicon, germanium, silicon germanium, silicon carbide, gallium arsenide, or gallium indium, etc. In some embodiments, the semiconductor structure may also be a silicon on insulator (SOI) substrate, a germanium on insulator (GOI) substrate, or a glass substrate, etc. The semiconductor substrate may be made of a material that is easy to meet the process requirements and to be integrated.

In one embodiment, the fins 120 are made of a same material as the semiconductor substrate, such as single crystalline silicon. In some embodiments, the fins and the semiconductor substrate may be made of different materials. The fins may be made of germanium, silicon germanium, silicon carbide, gallium arsenide, or gallium indium, etc.

The first filling layer 141 and the first hard mask layer 151 may be used to cover the base substrate in the first region 101 to protect the base substrate in the first region 101 during the first treatment process. Thus, the adverse effect of the first treatment process to the base substrate in the first region 101 may be prevented.

The first filling layer 141 may fill the gaps between adjacent fins 120 in the first region 101; and the top surface of the first filling layer 141 may be higher than the top surfaces of the fins 120. The hard mask layer 151 may cover the first filling layer 141. The first filling layer 141 and the first hard mask layer 142 may both expose the fins 120 in the second region 102.

In one embodiment, the first filling layer 141 may be made of a spin-coated carbon material. In some embodiments, the first filling layer may also be made of one or more of a spin-coated carbon material, a bottom anti-reflective coating material, and an organic dielectric material, etc.

Using one or more of a spin-coated carbon material, a bottom anti-reflective coating material, and an organic dielectric material to form the first filling layer 141 may be able to improve the surface flatness of the first filling layer 141. Accordingly, the precision and the quality of the first hard mask layer 151 may be improved; and the precision and the quality of the first filling layer 141 may be improved.

In one embodiment, the first hard mask layer 151 is made of a silicon-containing bottom anti-reflective coating material. Because a silicon-containing bottom anti-reflective coating material may have a relatively high density. Comparing with the first filling layer 141, the first hard mask layer 151 may have a relatively high etching selectivity ratio. Accordingly, the quality of the first filling layer 141 may be effectively increased; and the precision and the yield of the patterning process may be effectively increased. Further, using the silicon-containing bottom anti-reflective coating material as the first hard mask layer 151 may be able to increase the process compatibility between the process for forming the first hard mask layer 151 and the process for forming the first filling layer 141. Accordingly, the process difficulty may be reduced; and the yield of the semiconductor structure may be increased.

The thickness of the first hard mask layer 151 may be any appropriate value. If the thickness of the first hard mask layer 151 is too small, the masking effect of the first hard mask layer 151 during forming the filling layer 141 may be affected. Further, the protection ability of the first hard mask layer 151 during the subsequent first treatment process may be affected; and the precision and the yield of the first treatment process may be adversely affected. If the thickness of the first hard mask layer 151 is too large, it may cause a waste of material; and the process difficulty may be increased.

In one embodiment, the thickness of the first hard mask layer 151 may be in a range of approximately 20 Å-1000 Å.

In one embodiment, for illustrative purposes, the process for forming the doped regions of different types of the transistors is described, the first treatment process may be a first ion implantation process 160 performed on the base substrate in the second region 102 to form a first doped region 171.

The first doped region 171 may be used to form the doped source/drain regions of the semiconductor structure. In some embodiments, the first ion implantation process may be a lightly doped ion implantation process, a pocket ion implantation process, or an anti-punch-through ion implantation process, etc.

In one embodiment, the base substrate in the second region 102 may be used to form N-type transistors. Thus, the first doped region 171 may be doped with N-type ions, such as phosphor ions, arsenic ions, or antimony ions, etc.

The second filling layer 142 and the second hard mask layer 152 may be used to cover the base substrate in the second region 102 so as to protect the base substrate in the second region 102 during the subsequent second treatment process. The adverse effect of the second treatment process to the base substrate in the second region 102 may be avoided.

In one embodiment, the second filling layer 142 may fill the gaps between the adjacent fins 120 in the second region 102. The top surface of the second filling layer 142 may be above the top surfaces of the second fins 120. The second hard mask layer 152 may cover at least the second filling layer 142; and may also be on the top surface of the first hard mask layer 151.

In one embodiment, the second filling layer 142 may be made of one or more of a bottom anti-reflective coating material, an organic dielectric material, and a spin-coated carbon material, etc. The gap filling ability of the second filling layer 142 may be sufficiently good to fill the gaps between adjacent fins 120. Accordingly, the protective ability of the second filling layer 142 may be improved.

Using one or more of a bottom anti-reflective coating material, an organic dielectric material, or a spin-coated carbon material, etc. as the material of the second filling layer 142 may be able to increase the flatness of the second filling layer 142. Thus, a relatively flat surface may be provided for subsequently forming a second hard mask layer; and the quality of the second hard mask layer 152 may be improved.

Further, as shown in FIG. 13, in one embodiment, the top surface of the second filling layer 142 may be lower than the top surface of the first filling layer 141. Such a configuration may be able to reduce the process difficulty of the subsequent processes; and effectively increase the surface flatness of the second hard mask layer 152. Thus, the quality of the second hard mask layer 152 may be increased; and the yield and the performance of the semiconductor structure may be improved.

The height difference "H" between the top surface of the second filling layer 142 and the top surface of the first filling layer 141 may be any appropriate value. If the height difference "H" between the top surface of the second filling layer 142 and the top surface of the first filling layer 141 is too small, the process difficulty for subsequently forming the second hard mask layer may be increased; and it may be not easy to improve the yield and the performance of the semiconductor structure.

In one embodiment, the height difference "H" between the top surface of the second filling layer 142 and the top surface of the first filling layer 141 may be greater than, or equal to approximately 50 Å.

In one embodiment, the second hard mask layer 152 may be made of one or more of silicon oxide and silicon nitride. Using one or more of silicon oxide and silicon nitride as the material of the second hard mask layer 152 may increase the compactness of the second hard mask layer 152; and reduce the etching selectivity ratio. Thus, the protective ability of the second hard mask layer 152 to the base substrate in the second region 102 treated by the first treatment process may be effectively improved; and the process difficulty may be reduced; and the yield of the semiconductor structure may be increased.

To allow the second hard mask layer 152 on the second filling layer 142 to still have a left-over portion after subsequently removing the first hard mask layer 151 and the first filling layer 141 and protect the base substrate in the second region 102 during a subsequent second treatment process, in one embodiment, the total thickness "D1" of the first hard mask layer 151 and the hard mask layer 152 on the first hard mask layer 151 may be smaller than the thickness "D2" of the second hard mask layer 152 on the second filling layer 142.

The thickness "D2" of the second hard mask layer 152 on the second filling layer 142 may be any appropriate value. If the thickness "D2" of the second hard mask layer 152 on the second filling layer 142 is too small, the thickness of the remaining second hard mask layer 152 after subsequently removing the first hard mask layer 151 and the first filling layer 141 may be too small, the protective ability of the second hard mask layer 152 to the base substrate in the second region 102 may be adversely affected. Thus, the probability of the damage to the base substrate in the second region 102 may be increased; and it may not facilitate to increase the yield and the performance of the semiconductor structure.

In one embodiment, the thickness "D2" of the second hard mask layer 152 on the first filling layer 142 may be greater than, or equal to approximately 50 Å.

The first hard mask layer 152 and the first filling layer 141 may be subsequently removed to expose the base substrate in the first region 101, a process base for subsequent processes may be provided. Further, during the process for removing the first hard mask layer 151 and the first filling layer 141 after forming the second hard mask layer 152, the second hard mask layer 152 may be patterned simultaneously. Thus, an extra process for patterning the second mask layer 152 may be avoided. Thus, the overlay alignment issue from multiple-patterning processes may be avoided; and the precision of the patterning process may be improved. Further, reducing the times of the patterning processes may simply the fabrication process; and reduce the production cost.

In the disclosed method for fabricating a semiconductor structure, after performing the first treatment process, a second filling layer and a second hard mask layer may be sequentially formed. After forming the second hard mask layer, the first hard mask layer and the first filling layer may be removed. During the process for removing the first hard mask layer and the first filling layer, the second hard mask layer may be patterned simultaneously. Thus, the extra process for patterning the second hard mask layer may be avoided. For example, only one time patterning process may need. Accordingly, the overlay alignment issue of multiple patterning processes may be avoided; and the precision of the patterning process may be improved; and the performance of the semiconductor structure may be improved. Further, reducing the times of the patterning processes may be able to simplify the fabrication process; and reduce the production cost.

Further, by forming the second filling layer with a top surface lower than the top surface of the first filling layer, the height difference may be formed between the second filling layer and the first filling layer. Using the height difference may cause the thickness of the second hard mask layer in the second region to be greater than the total thickness of the first hard mask layer and the second mask layer in the first region. Thus, after subsequently removing the first hard mask layer, a portion of the second hard mask layer on the second filling layer may be still left on the surface of the second filling layer; and the remaining second hard mask layer on the second filling layer may be used as a mask during the second treatment process. Such a configuration may reduce the process difficulty for forming the second hard mask layer; and no extra mask is needed for patterning the second hard mask layer. Thus, the fabrication process may be simplified; and the yield and the performance of the semiconductor structure may be improved.

Further, the first filling layer, the second filling layer, the first hard mask and the second hard mask layer may all be formed by spin-coating processes. The spin-coating processes may be able to effectively improve the gap filling abilities of the first filling layer and the second filling layer. Accordingly, the quality of the first filling layer and the second filling layer may be improved. Further, the spin-coating processes may be able to increase the surface flatness of the first filling layer, the second filling layer, the first hard mask layer and the second hard mask layer. Accordingly, the precision of the patterning processes may be improved; and the yield and the performance of the semiconductor structure may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a semiconductor structure, comprising:
   providing a base substrate having a first region and a second region;
   forming a first filling layer on the first region of the base substrate and forming a first hard mask layer on the first filling layer;
   performing a first treatment process on the second region of the base substrate using the first hard mask layer and the first filling layer as a mask;
   forming a second filling layer on the second region of the base substrate and forming a second hard mask on at least the second filling layer, wherein a top surface of the second filling layer is lower than a top surface of the first filling layer;
   removing the first hard mask layer and the first filling layer to expose the first region of the base substrate and to pattern the second hard mask layer on the second filling layer; and
   performing a second treatment process on the first region of the base substrate.

2. The method according to claim 1, wherein:
   the first hard mask layer is formed by at least one of a spin-coating process and a chemical vapor deposition process.

3. The method according to claim 1, wherein forming the first filling layer and the first hard mask layer comprises:
   forming a first filling material layer over the base substrate and a first hard mask material layer on the first filling material layer;
   patterning the first hard mask material layer to form the first hard mask layer exposing the first filling material layer in the second region; and
   removing an exposed portion of the first filling material layer in the second region using the first hard mask layer as a mask.

4. The method according to claim 1, wherein:
   the second hard mask layer is made of at least one of silicon oxide and silicon nitride.

5. The method according to claim 1, wherein:
   the second hard mask layer is formed by a spin-coating process.

6. The method according to claim 1, wherein:
   the second hard mask layer is formed on the second filling layer and the first hard mask layer.

7. The method according to claim 6, wherein:
   a total thickness of the first hard mask layer and a portion of the second hard mask layer on the first hard mask layer is smaller than a thickness of a portion second hard mask layer on the second filling layer.

8. The method according to claim 1, wherein forming the second filling layer and the second hard mask layer comprises:
   forming a second filling material layer on the second region of the base substrate treated by the first treatment process and on the first hard mask layer;
   performing a first etch-back process to form the second filling layer; and
   forming the second hard mask layer on the second filling layer.

9. The method according to claim 1, wherein:
   a height difference between the top surface of the second filling layer and the top surface of the first filling layer is greater than, or equal to approximately 50 Å.

10. The method according to claim 1, wherein:
    the first filling layer is made of at least one of a bottom anti-reflective coating material, an organic dielectric material and a spin-coated carbon material; and
    the second filling layer is made of at least one of a bottom anti-reflective coating material, an organic dielectric material and a spin-coated carbon material.

11. The method according to claim 1, after performing the second treatment process, further comprising:
    forming a third filling layer on the first region of the base substrate;
    performing a third etch-back process to remove the second hard mask layer; and
    performing an ashing process to remove the second filling layer and the third filling layer.

12. The method according to claim 11, wherein:
    the third filling layer is made of one or more of a bottom anti-reflective coating material, an organic dielectric material and a spin-coated carbon material.

13. The method according to claim 1, wherein:
    the first treatment process is a first ion implantation process performed on the second region of the base substrate; and
    the second treatment process is a second ion implantation process performed on the first region of the base substrate.

14. A method for fabricating a semiconductor structure, comprising:
    providing a base substrate having a first region and a second region;
    forming a first filling layer on the first region of the base substrate and forming a first hard mask layer on the first filling layer;
    performing a first treatment process on the second region of the base substrate using the first hard mask layer and the first filling layer as a mask;
    forming a second filling layer on the second region of the base substrate and forming a second hard mask on at least the second filling layer;
    removing the first hard mask layer and the first filling layer to expose the first region of the base substrate and to pattern the second hard mask layer on the second filling layer; and
    performing a second treatment process on the first region of the base substrate, wherein removing the first hard mask layer and the first filling layer comprises:
    performing a second etch-back process on the first hard mask layer and the second hard mask layer to expose the first filling layer; and
    removing the first filling layer to expose the first region of the base substrate using the second hard mask layer as a mask.

15. The method according to claim 14, wherein:
    the first hard mask layer is formed by at least one of a spin-coating process and a chemical vapor deposition process.

16. The method according to claim 14, wherein forming the first filling layer and the first hard mask layer comprises:
    forming a first filling material layer over the base substrate and a first hard mask material layer on the first filling material layer;

patterning the first hard mask material layer to form the first hard mask layer exposing the first filling material layer in the second region; and removing an exposed portion of the first filling material layer in the second region using the first hard mask layer as a mask.

17. The method according to claim 14, wherein:
the second hard mask layer is made of at least one of silicon oxide and silicon nitride.

18. The method according to claim 14, wherein:
the second hard mask layer is formed by a spin-coating process.

19. A method for fabricating a semiconductor structure, comprising:
providing a base substrate having a first region and a second region;
forming a first filling layer on the first region of the base substrate and forming a first hard mask layer on the first filling layer, wherein:
the first hard mask layer is made of a silicon-containing bottom anti-reflective coating material;
performing a first treatment process on the second region of the base substrate using the first hard mask layer and the first filling layer as a mask;
forming a second filling layer on the second region of the base substrate and forming a second hard mask on at least the second filling layer;
removing the first hard mask layer and the first filling layer to expose the first region of the base substrate and to pattern the second hard mask layer on the second filling layer; and
performing a second treatment process on the first region of the base substrate.

* * * * *